(12) United States Patent
Patel et al.

(10) Patent No.: US 9,261,696 B2
(45) Date of Patent: Feb. 16, 2016

(54) MICROMIRROR ARRAY ASSEMBLY

(71) Applicant: Texas Instruments Incorporated, Dallas, TX (US)

(72) Inventors: Satyadev Patel, Sunnyvale, CA (US); Andrew G. Huibers, Sunnyvale, CA (US); Peter Richards, Menlo Park, CA (US); Terry Tarn, San Diego, CA (US); Dietrich Dehlinger, San Diego, CA (US)

(73) Assignee: TEXAS INSTURMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/247,304

(22) Filed: Apr. 8, 2014

(65) Prior Publication Data

US 2014/0299653 A1    Oct. 9, 2014

Related U.S. Application Data

(60) Continuation of application No. 12/853,411, filed on Aug. 10, 2010, now Pat. No. 8,693,082, which is a division of application No. 10/869,539, filed on Jun. 15, 2004, now Pat. No. 7,787,170.

(51) Int. Cl.
*G02B 26/00* (2006.01)
*G02B 26/08* (2006.01)
*B81C 3/00* (2006.01)

(52) U.S. Cl.
CPC ............ *G02B 26/0841* (2013.01); *B81C 3/001* (2013.01); *Y10S 359/90* (2013.01); *Y10T 156/10* (2015.01)

(58) Field of Classification Search
USPC .......................... 359/290, 291, 295, 298, 900
See application file for complete search history.

(56) References Cited

U.S. PATENT DOCUMENTS

| 3,517,126 A | 6/1970 | Yamada et al. |
| 3,553,364 A | 1/1971 | Lee |
| 3,600,798 A | 8/1971 | Lee |
| 3,678,196 A | 7/1972 | Roth |
| 3,746,785 A | 7/1973 | Goodrich |
| 3,746,911 A | 7/1973 | Nathanson et al. |
| 3,886,310 A | 5/1975 | Guldberg et al. |

(Continued)

OTHER PUBLICATIONS

Jaecklin, "Line-Addressable Torsional Micromirrors for Light Modulator Arrays", Sensor and Actuators A, 41-42, Elsevier Science, pp. 324-329.

(Continued)

*Primary Examiner* — Jack Dinh
(74) *Attorney, Agent, or Firm* — Jacqueline J. Garner; Frank D. Cimino

(57) ABSTRACT

The present invention provides a microstructure device comprising multiple substrates with the components of the device formed on the substrates. In order to maintain uniformity of the gap between the substrates, a plurality of pillars is provided and distributed in the gap so as to prevent decrease of the gap size. The increase of the gap size can be prevented by bonding the pillars to the components of the microstructure. Alternatively, the increase of the gap size can be prevented by maintaining the pressure inside the gap below the pressure under which the microstructure will be in operation. Electrical contact of the substrates on which the micromirrors and electrodes are formed can be made through many ways, such as electrical contact areas, electrical contact pads and electrical contact springs.

9 Claims, 11 Drawing Sheets

(56) References Cited

U.S. PATENT DOCUMENTS

| | | |
|---|---|---|
| 4,229,732 A | 10/1980 | Hartstein et al. |
| 4,356,730 A | 11/1982 | Cade |
| 4,383,255 A | 5/1983 | Grandjean et al. |
| 4,403,248 A | 9/1983 | Te Velde |
| 4,492,435 A | 1/1985 | Banton et al. |
| 4,566,935 A | 1/1986 | Hornbeck |
| 4,571,603 A | 2/1986 | Hornbeck et al. |
| 4,592,628 A | 6/1986 | Altman et al. |
| 4,596,992 A | 6/1986 | Hornbeck |
| 4,662,746 A | 5/1987 | Hornbeck |
| 4,680,579 A | 7/1987 | Ott |
| 4,698,602 A | 10/1987 | Armitage |
| 4,710,732 A | 12/1987 | Hornbeck |
| 4,786,149 A | 11/1988 | Hoenig et al. |
| 4,805,038 A | 2/1989 | Seligson |
| 4,954,789 A | 9/1990 | Sampsell |
| 4,956,619 A | 9/1990 | Hornbeck |
| 4,998,262 A | 3/1991 | Wiggers |
| 5,061,049 A | 10/1991 | Hornbeck |
| 5,078,479 A | 1/1992 | Vuilleumier |
| 5,085,497 A | 2/1992 | Um et al. |
| 5,172,262 A | 12/1992 | Hornbeck |
| 5,196,767 A | 3/1993 | Leard et al. |
| 5,216,537 A | 6/1993 | Hornbeck |
| 5,287,215 A | 2/1994 | Warde et al. |
| 5,311,360 A | 5/1994 | Bloom et al. |
| 5,416,514 A | 5/1995 | Janssen et al. |
| 5,442,414 A | 8/1995 | Janssen et al. |
| 5,444,566 A | 8/1995 | Gale et al. |
| 5,448,314 A | 9/1995 | Heimbuch et al. |
| 5,452,024 A | 9/1995 | Sampsell |
| 5,458,716 A | 10/1995 | Alfaro et al. |
| 5,471,341 A | 11/1995 | Warde et al. |
| 5,493,439 A | 2/1996 | Engle |
| 5,508,738 A | 4/1996 | Janssen et al. |
| 5,535,047 A | 7/1996 | Hornbeck |
| 5,552,925 A | 9/1996 | Worley |
| 5,557,177 A | 9/1996 | Engle |
| 5,567,334 A | 10/1996 | Baker et al. |
| 5,579,149 A | 11/1996 | Moret et al. |
| 5,579,151 A | 11/1996 | Cho |
| 5,583,688 A | 12/1996 | Hornbeck |
| 5,631,782 A | 5/1997 | Smith et al. |
| 5,636,070 A | 6/1997 | Ji et al. |
| 5,669,687 A | 9/1997 | Yang |
| 5,677,784 A | 10/1997 | Harris |
| 5,706,061 A | 1/1998 | Marshall et al. |
| 5,768,009 A | 6/1998 | Little |
| 5,774,196 A | 6/1998 | Marshall |
| 5,784,190 A | 7/1998 | Worley |
| 5,808,780 A | 9/1998 | McDonald |
| 5,835,256 A | 11/1998 | Huibers |
| 5,926,309 A | 7/1999 | Little |
| 5,999,306 A | 12/1999 | Atobe et al. |
| 6,046,840 A | 4/2000 | Huibers |
| 6,053,617 A | 4/2000 | Kaeriyama |
| 6,107,115 A | 8/2000 | Atobe et al. |
| 6,337,760 B1 | 1/2002 | Huibers et al. |
| 6,356,378 B1 | 3/2002 | Huibers |
| 6,489,178 B2 | 12/2002 | Coyle et al. |
| 6,642,987 B2 | 11/2003 | Chung et al. |
| 6,650,461 B2 | 11/2003 | Atobe et al. |
| 6,658,077 B2 | 12/2003 | Alsmeyer et al. |
| 6,745,449 B2 | 6/2004 | Hanna et al. |
| 6,827,449 B1 | 12/2004 | Klonis et al. |
| 6,838,762 B2 | 1/2005 | Tao et al. |
| 6,849,471 B2 | 2/2005 | Patel et al. |
| 6,867,897 B2 | 3/2005 | Patel et al. |
| 6,873,450 B2 | 3/2005 | Patel et al. |
| 6,885,494 B2 | 4/2005 | Patel et al. |
| 6,913,942 B2 | 7/2005 | Patel et al. |
| 6,949,807 B2 | 9/2005 | Eskridge et al. |
| 7,019,376 B2 | 3/2006 | Patel et al. |
| 7,042,622 B2 | 5/2006 | Huibers |
| 7,068,125 B2 | 6/2006 | Lutz et al. |
| 7,068,126 B2 | 6/2006 | Huang et al. |
| 7,090,787 B2 | 8/2006 | Malone et al. |
| 7,099,065 B2 | 8/2006 | Patel et al. |
| 7,787,170 B2 | 8/2010 | Patel et al. |
| 8,693,082 B2 * | 4/2014 | Patel et al. .................. 359/291 |
| 2002/0114058 A1 | 8/2002 | DeReus et al. |
| 2003/0054588 A1 | 3/2003 | Patel et al. |
| 2004/0125346 A1 | 7/2004 | Huibers |

OTHER PUBLICATIONS

Gerhard-Multhaupt et al., "Light-Valve Projection Displays—An Introduction", Displays, vol. 16, No. 1, 1995, Elsevier Science B.V., pp. 5-7.

Gerhard-Multhaupt, "Light-Valve Technologies for High-Definition Television Projection Displays", Displays, 1991, vol. 12, No. 3/4, pp. 115-128.

Peterson, K.E., "Micromechanical Light Modulator Array Fabricated on Silicon", Applied Physics Letters, American Institute of Physics, vol. 31, No. 8, Oct. 15, 1977, pp. 521-523.

Cadman et al., "New Micromechanical Display Using Metallic Thin Films", IEEE Electron Device Letters, Jan. 1983, vol. EDL-4, No. 1, pp. 3-4.

Thomas et al., "The Mirror Matrix Tube: A Novel Light Valve for Projection Displays", IEEE Transactions on Electron Devices, vol. Ed-22, No. 9, Sep. 1975, pp. 765-775.

Hornbeck, "Digital Light Processing (TM) for High-Brightness, High Resolution Applications", Texas Instruments Incorporated, date unknown, pp. 1-14.

Yoder, "The Digital Display Technology of the Future", Texas Instruments Incorporated, date unknown, pp. 1-11.

Peterson, "Silicon Torsional Scanning Mirror", IBM J. Res. Develop., vol. 24, No. 5, Sep. 1980, pp. 631-637.

* cited by examiner

MICROMIRROR ARRAY ASSEMBLY

This application is a continuation of U.S. application Ser. No. 12/853,411, filed Aug. 10, 2010, which is a division of U.S. application Ser. No. 10/869,539, filed Jun. 15, 2004 (now U.S. Pat. No. 7,787,170), the entireties of both of which are incorporated herein by reference.

TECHNICAL FIELD OF THE INVENTION

The present invention is related generally to the art of microelectromechanical systems, and, more particularly, to spatial light modulators having array of micromirrors and methods of making the same.

BACKGROUND OF THE INVENTION

Microstructures such as microelectromechanical systems are often fabricated on one or more substrates. These substrates may deform during fabrication or operation, causing degradation of the device performance or even device failure when the deformation exceeds a tolerable amount. Moreover, in those microstructures having multiple substrates, a uniform gap between two substrates is often required for ensuring desired functions or performance of the microstructure.

As an example, FIG. 1 illustrates a portion of a micromirror array device which is a type of microelectromechanical device. An array of mirror plates such as mirror plate 120 is formed on glass substrate 116. The mirrors are operable to rotate relative to the glass substrate for reflecting light into different directions. The micromirrors are individually addressable and the addressing can be accomplished through an array of electrodes (e.g. electrode 122) and circuitry on semiconductor substrate 114. Specifically, an electrostatic field is established between each mirror plate and the electrode associated with the mirror plate. The strength of such electrostatic field complies with the voltage (often referred to as data bit) stored in the circuitry connected to the electrode. By setting the voltage through writing the data bit in the circuitry, the strength of the electrostatic field and thus the rotation position of the mirror plate can be adjusted. Because the rotation of the mirror plate is determined by the strength of the electrostatic field that further depends upon the distance between the mirror plate and the associated electrode, it is desired that such distance is uniform for all micromirrors.

However, a uniform distance throughout the micromirror array may not be guaranteed in fabrication or in operation or in both due to deformation of the substrates on which the micromirrors and electrodes are formed. The deformation may arise from many factors, such as temperature change, variation of the pressure applied to the substrates and other factors, such as attractive or expellant electrostatic forces between the substrates when the substrates are electrically charged. The deformation changes the gap size, which in turn changes the effective strength of the electrostatic field. As a consequence, desired operation or performance of the device is not achievable.

In addition to the substrate deformation, other factors, such as operation environment (e.g. contamination and viscosity) may also degrade the operation and performance of the micromirror array device. Contamination is often solved by packaging the device, such as hermetically packaging the device. Viscosity problems arise from the viscosity resistance to the rotation of the mirror plate in a medium, such as air or the gas (e.g. an inert gas). The viscosity resistance to the movement of the mirror plate reduces the response time of the mirror plate and limits the application of the micromirror array device.

Therefore, what is needed is a micromirror array device that is mechanically robust and has improved performance.

SUMMARY OF THE INVENTION

In an embodiment of the invention, a microelectromechanical (MEMS) device is disclosed. The device comprises: a first substrate and a second substrate; a plurality of MEMS elements formed on the first substrates; and a plurality of pillars disposed between the second substrate and the MEMS elements.

In another embodiment of the invention, a spatial light modulator for use in a projection system is disclosed. The spatial light modulator comprises: a micromirror array device, comprising: a first substrate having thereon an array of micromirrors; a second substrate having an array of electrodes for deforming the micromirrors; and a plurality of pillars disposed between the substrates such that the first substrate is connected to the second substrate via the micromirror and the pillar for maintaining a uniform gap between the substrates.

In yet another embodiment of the invention, a micromirror device is disclosed. The device comprises: a first substrate; a post on the substrate; a mirror plate attached to a hinge that is held by the post on the substrate such that the mirror plate rotates on the substrate; a pillar on the mirror plate and in connection with the post; and a second substrate having an electrode and circuitry disposed thereon for rotating the mirror plate, wherein the second substrate is disposed on the pillar and connected to the pillar such that the distance between the first and second substrate is maintained at a substantially constant value.

In yet another embodiment of the invention, a method of making a spatial light modulator is disclosed. The method comprises: forming an array of micromirrors on first substrate; forming an array of electrodes and circuitry on second substrate; forming a plurality of pillars on the second substrate; aligning each pillar with one of the micromirrors; and bonding the substrates.

In yet another embodiment of the invention, a micromirror array device is disclosed, which comprises: a substrate having thereon an array of micromirrors, further comprising: at least two electrical contact pads, each of which is electrically connected to the micromirrors such that am electrical resistance of the micromirrors of the array can be measured through the electrical contact pads; and an array of electrodes associated with the micromirrors for deflecting the micromirrors.

In yet another embodiment of the invention, a spatial light modulator is provided, which comprises: an array of micromirrors on a first substrate; an array of electrodes and circuitry on a second substrate; a first sealing material that hermetically bonds the first and second substrates; and a second sealing material other than the first seal material contracting the first and second substrate for enhancing the hermetic seal with the first sealing material.

In yet another embodiment of the invention, a microelectromechanical device is provided. The device comprises: a first and second substrate bonded together; an array of MEMS elements formed on the first substrate and disposed between the substrates; an array of electrodes and circuitry disposed between the bonded substrates but spaced apart from the array of MEMS elements; and a plurality of pillars disposed between the second substrate and the MEMS elements.

In yet another embodiment of the invention, a method of forming a spatial light modulator for use in a display system is disclosed. The method comprises: forming a plurality of micromirrors on a light transmissive substrate, wherein each micromirror has a fixed portion and a movable portion; forming a plurality of electrodes and circuitry on a semiconductor substrate; and forming a pillar on the fixed portion of the micromirror and/or on the semiconductor substrate.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

The present invention provides a microstructure device comprising multiple substrates with the functional components of the device formed on the substrates. In order to maintain a uniform gap between the substrates, a plurality of pillars is provided and distributed within the gap. The gap uniformity can further be enhanced by maintaining the pressure inside the gap below the pressure under which the microstructure device will be in operation.

In the following, the present invention will be discussed with reference to examples in which a microelectromechanical device comprises an array of micromirrors formed on two substrates. It is understood by those skilled in the art that the following discussion is for demonstration purposes only and will not be interpreted as a limitation. Though the invention will be discussed with reference to the following example, it is not intended to exclude other variations within the scope of the present invention. For example, the present invention can be implemented in other microstructures having functional components formed on single or multiple substrates.

Figure 2:
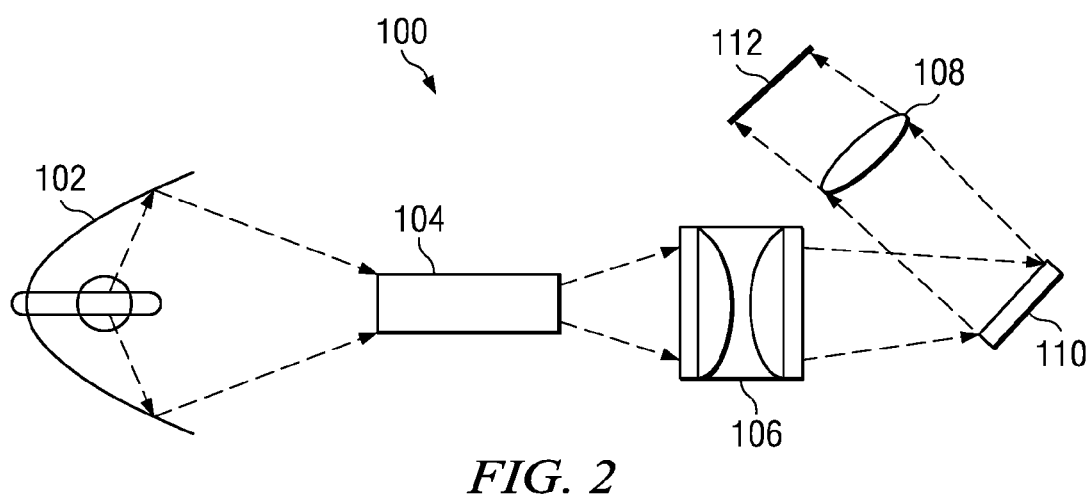
FIG. 2 illustrates a display system having a spatial light modulator in which embodiments of the invention can be implemented.

Turning to the drawings, FIG. 2 illustrates an exemplary display system in which embodiment of the invention may be implemented. In its basic configuration, display system 100 comprises light source 102, optical elements (e.g. light pipe 104, collection lens 106 and projection lens 108), display target 112 and spatial light modulator 110 that often comprises an array of thousands or millions of micromirrors that are individually addressable.

In operation, light from the light source (e.g. an arc lamp) travels through the light pipe and collection lens and shines on the micromirrors of the spatial light modulator. The micromirrors individually reflect the incident light from the light source either onto (when in their "ON" position) or away from (when in their "OFF" state) the projection lens, resulting in an image on display target 112.

Figure 3:
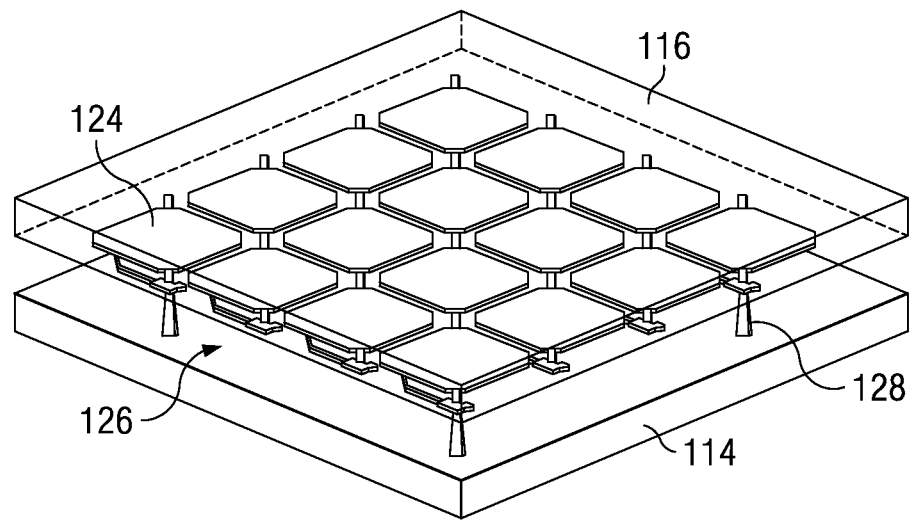
FIG. 3 is a perspective view of a portion of a spatial light modulator having an array of micromirrors according to the invention.

FIG. 3 shows a portion of an exemplary spatial light modulator in FIG. 2. The spatial light modulator comprises an array of mirror plates 124 formed on glass substrate 116, which is transmissive to visible light. The mirror plates are individually addressable and operable to rotate for reflecting incident light from the light source into different spatial directions. The rotation of the mirror plates is driven by an array of electrodes (e.g. electrode array 126) formed on substrate 114, which is a semiconductor substrate further having an array of circuitry (not show in the figure). The gap between the glass and semiconductor substrates is defined and maintained by one or more pillars, such as 128, which is better illustrated in FIG. 4. The distribution of the pillars in the micromirrors can be random or in accordance with a particular pattern, which will be discussed afterwards with reference to FIG. 15 through FIG. 18.

Figure 4:
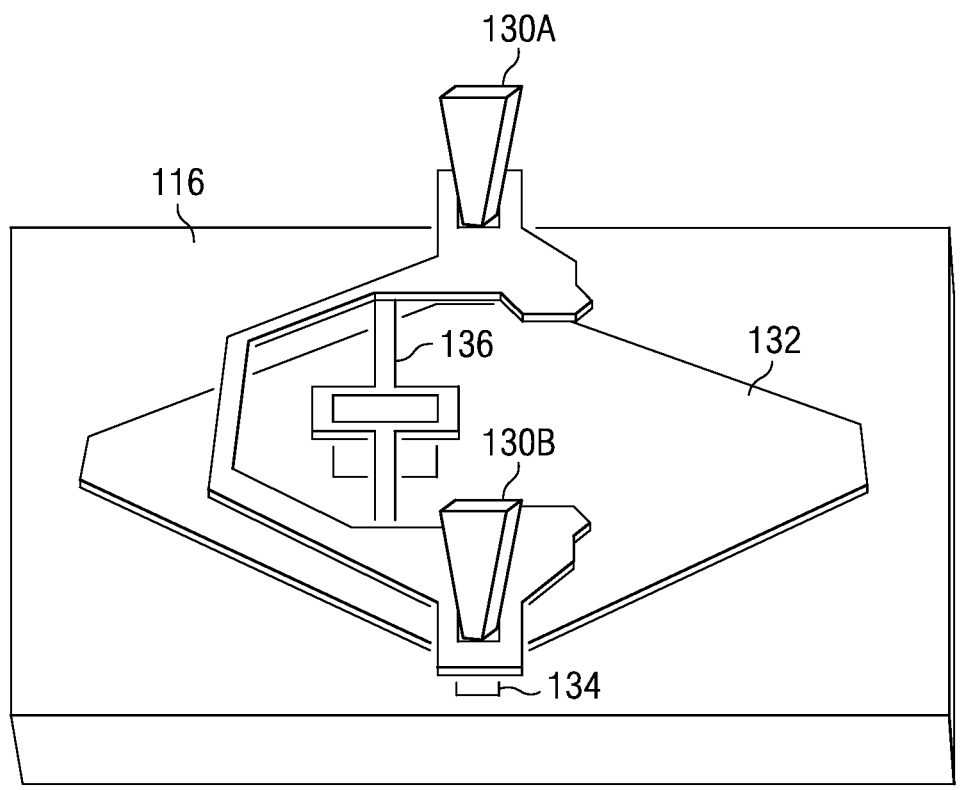
FIG. 4 is a perspective view of a portion of a micromirror of the micromirror array in FIG. 3.

Referring to FIG. 4, two posts 134 are formed on the glass substrate 116. The posts can be placed at any desired position relative to the mirror plate. For example, the posts can be placed at the ends of a predominant diagonal of the mirror plate such that a line connecting the posts is parallel to the diagonal. For another example, the posts can be placed around the ends of a predominant diagonal. For yet another example, the posts can be placed on the sides of the mirror plate. Other arrangements of the posts are also applicable. Hinge 136 is held by the posts on the substrate. The mirror plate is attached to the hinge such that the mirror plate can rotate above the glass substrate. As being illustrated in the figure, the mirror plate is attached to the hinge such the mirror plate can rotate asymmetrically. That is, the mirror plate can rotate to a larger angle in one direction than in the opposite direction. The hinge is parallel to but offset from a diagonal of the mirror plate when viewed from the top, and the attachment point of the mirror plate to the hinge is neither at the center of the mirror plate nor along a virtual line connecting posts 130A and 130B. In other examples, the mirror plate and the hinge can be formed such that the mirror plate can rotate symmetrically. Moreover, the hinge may not necessarily be a torsion hinge as shown in the figure. Instead, the hinge can be another type of non-torsion hinges (e.g. flexure hinge). The mirror plate rotates in response to an electrostatic field established between the mirror plate and the electrode that is formed on the semiconductor substrate, which is not shown in this figure. In order to keep a uniform gap between the substrates, pillars 128 are provided and the pillars are located on top of the posts and between the posts and the semiconductor substrate (not shown).

The pillars may take any desired form, such as polyhedron or cylinder. In this particular example, the pillars are tapered polyhedron with the butt ends contacting against the semiconductor substrate and the tail ends contacting against the posts (this shape due to being formed on the semiconductor substrate). The figure shows the micromirror has two posts and two pillars contacting the posts, this is not an absolute requirement. The micromirror may comprise two posts while only one pillar is provided for the micromirror. As another example, the micromirror may have only one post with one pillar connected to the post of the micromirror. In a micromirror array device such as that shown in FIG. 3, a pillar may not be provided for all micromirrors of the array, which will be discussed further afterwards with reference to FIG. 13 and FIG. 14.

Figure 5:
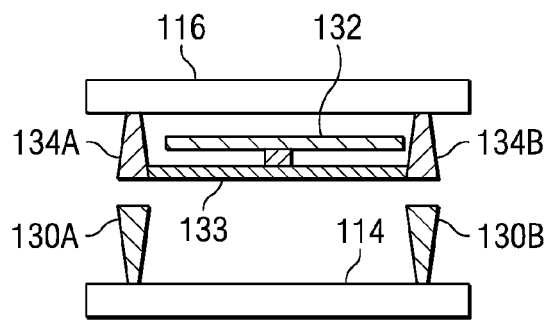
FIG. 5 through FIG. 10 are cross-sectional views of micromirror devices according to different embodiments of the invention.

The relative position of the posts, the pillars, and the substrates is better illustrated in FIG. 5, which is a cross-sectional view of the micromirror in FIG. 4 along line AA. Posts 134A and 134B are formed on glass substrate 116. Hinge 133 is held on the glass substrate by the posts. Mirror plate 132 is attached to the hinge such that the mirror plate can rotate relative to the substrate. Pillars 130A and 130B are formed on semiconductor substrate 114 that further comprises an electrode and circuitry for rotating the mirror plate (not shown). Each pillar is connected to a post such that the size of the gap between the substrates is defined as the summation of the heights of the post and the pillar and maintained at this constant value during operation. The pillar can be of any desired height. In this example, the height of the pillar is substantially equal to or greater than the height of the post. The contact point of the post to the pillar is substantially in the middle of the gap. In another example, the pillar is shorter than the post. As a result, the contact point of the pillar to the post is closer to substrate 114 than to substrate 116. In yet another example, the pillar has a larger height than the post. In this situation, the contact area of the post to the pillar is closer to substrate 116 than to substrate 114.

Figure 6:
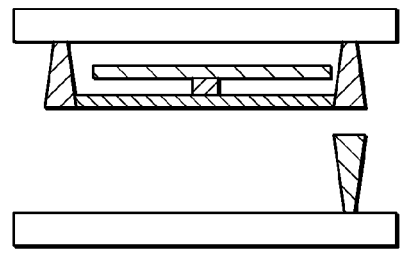

Instead of providing pillars for both posts of the micromirror device, the micromirror may have only one pillar as shown in FIG. 6. The pillar is connected to one of the posts of the micromirror device.

The pillar may comprise any suitable materials, such as polyimide or SU-8. SU-8 is a negative, epoxy-type, near-UV photoresist based on EPON SU-8 epoxy resin that has been originally developed, and patented (U.S. Pat. No. 4,882,245). As another example, the pillar comprises a material that has a coefficient of thermal expansion (CET) matching the CTE of the post. The pillar may alternatively comprise a material with a high thermal conductivity for improving heat dissipation. The material of the pillar can be electric conducting or insulating.

Figure 7:
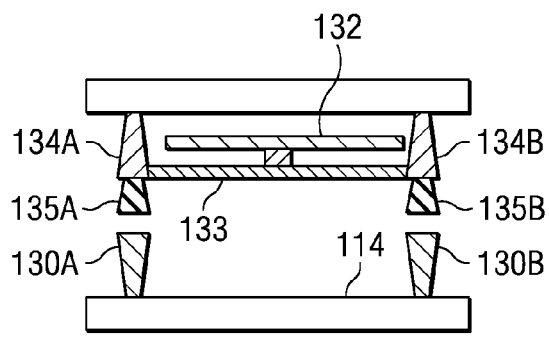
Figure 8:
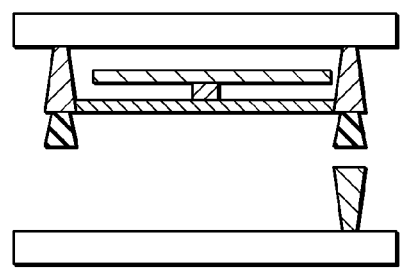

FIG. 7 shows another exemplary micromirror device with pillars provided. Instead of being connected to the posts, the pillars are connected to the protrusions of the posts. Specifically, pillar 130A is formed on substrate 114 and connected to protrusion 135A that is formed on post 134A, and pillar 130B is likewise formed on substrate 114 and connected to protrusion of 135B that is formed on post 134B. The protrusions may or may not be the same. The pillars of the microstructure also may or may not be the same. FIG. 8 shows the micromirror of FIG. 7 with only one pillar provided.

Figure 9:
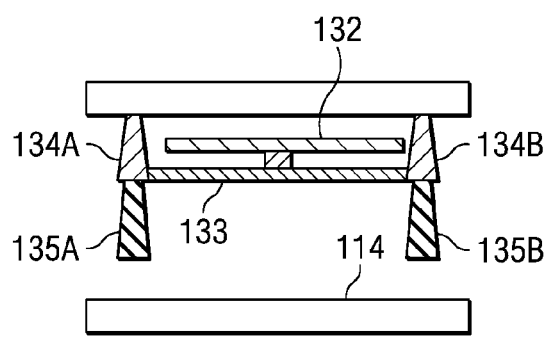
Figure 10:
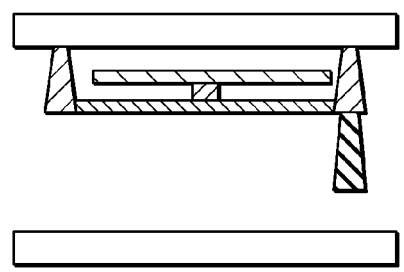

Referring to FIG. 9, a cross-sectional view of a micromirror device according to yet another embodiment of the invention is illustrated therein. In this particular example, pillars 135A and 135B are formed on the posts of the micromirror device and connected to substrate 114 when the two substrates are bonded together. Specifically, pillar 135A is formed on post 134A and connects post 134A to substrate 114. Likewise, pillar 135B is formed on post 134B and connects post 134B to substrate 114. The lengths of a post and the pillar formed on the post determine the gap between the two bonded substrates. The pillars and the posts in combination resist variation of the gap between the two substrates. As an alternative, not all posts of the micromirror device are provided with pillars. As an example shown in FIG. 10, one of the posts of the micromirror device is not provided with a pillar, however, at least one post of the micromirror device is provided with a pillar. In other alternatives wherein the micromirror device is part of a micromirror array device, a particular micromirror device of the array may not have a pillar, which will be discussed in the following with reference to FIGS. 13 and 14.

Figure 11:
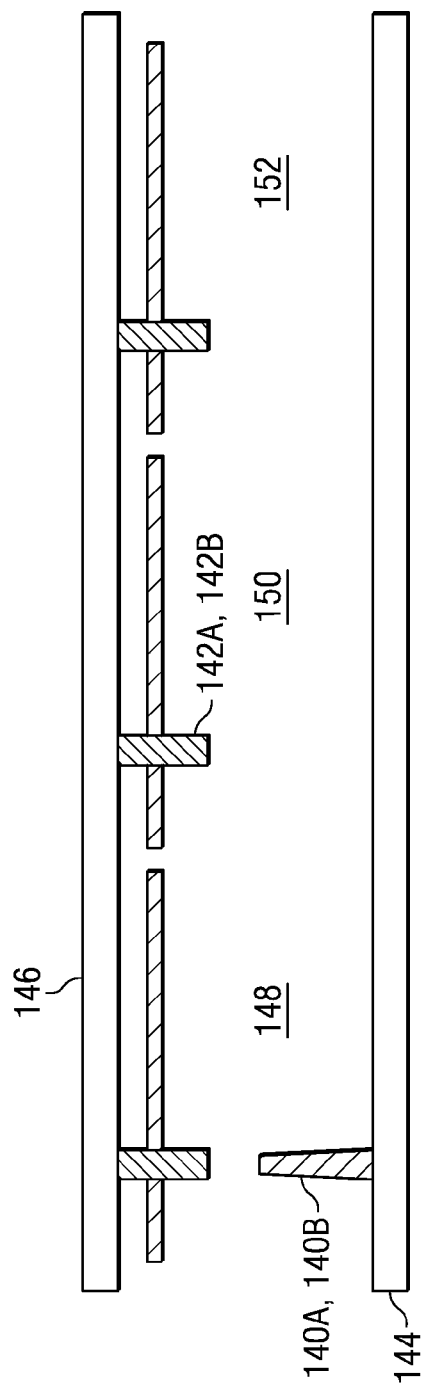
FIG. 11 is a cross-sectional view of a spatial light modulator in accordance with an embodiment of the invention.

In a device having an array of micromirrors, pillars may be provided for selected micromirrors. Referring to FIG. 11, a cross-sectional view of a row of the micromirror array from a different view angle from FIGS. 5 to 10 is illustrated therein. For simplicity purposes only, only three micromirrors are shown. The cross-section is taken along the line connecting the posts of the micromirror. In this particular example, micromirror 148 is provided with pillars (e.g. pillars 140A and 140B), while micromirrors 150 and 152 in the row of the array have no pillars. The pillars of micromirror 148 can be the pillars as discussed with reference to FIG. 5 through 10, or any desired pillars that are not discussed herein but are variations of the pillars as discussed above.

Figure 12:
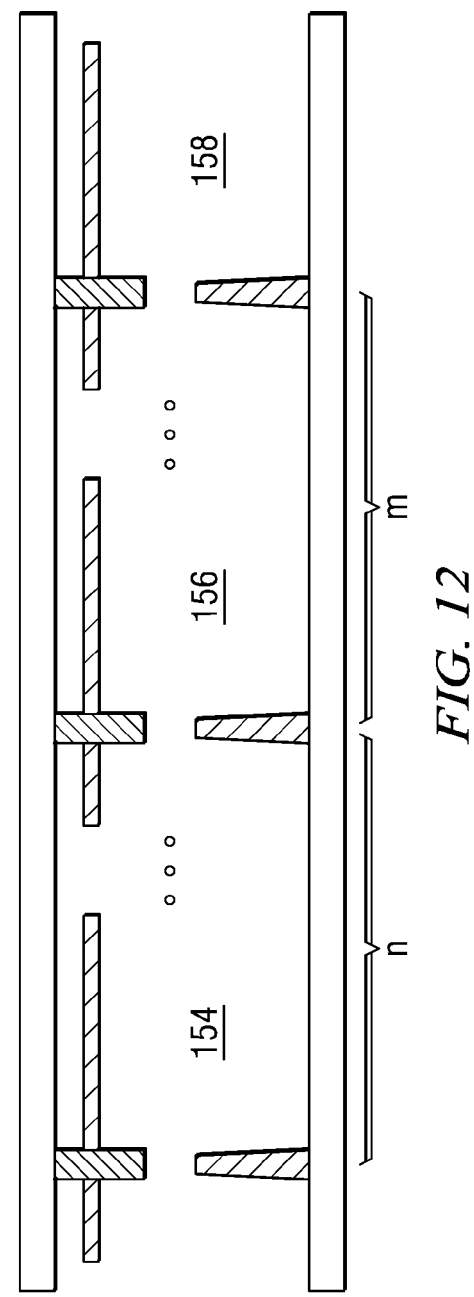
FIG. 12 is a cross-sectional view of a spatial light modulator in accordance with another embodiment of the invention.

FIG. 12 illustrates another exemplary micromirror array device. In this example, pillars are provided for micromirrors 154, 156 and 158. The micromirrors (with the number of n, wherein n is an integer and zero) between micromirrors 154 and 156 are not provided with pillars. And the micromirrors (with the number of m, wherein m is an integer and zero and may or may not be the same as n) between micromirrors 156 and 158 are not provided with pillars.

Figure 1:
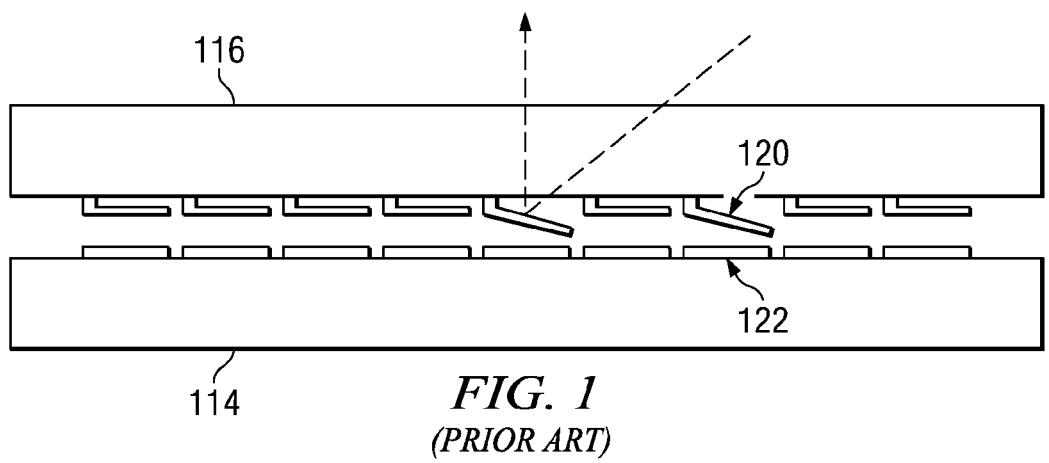
FIG. 1 is a cross-sectional view of a portion of the spatial light modulator in prior art.
Figure 13:
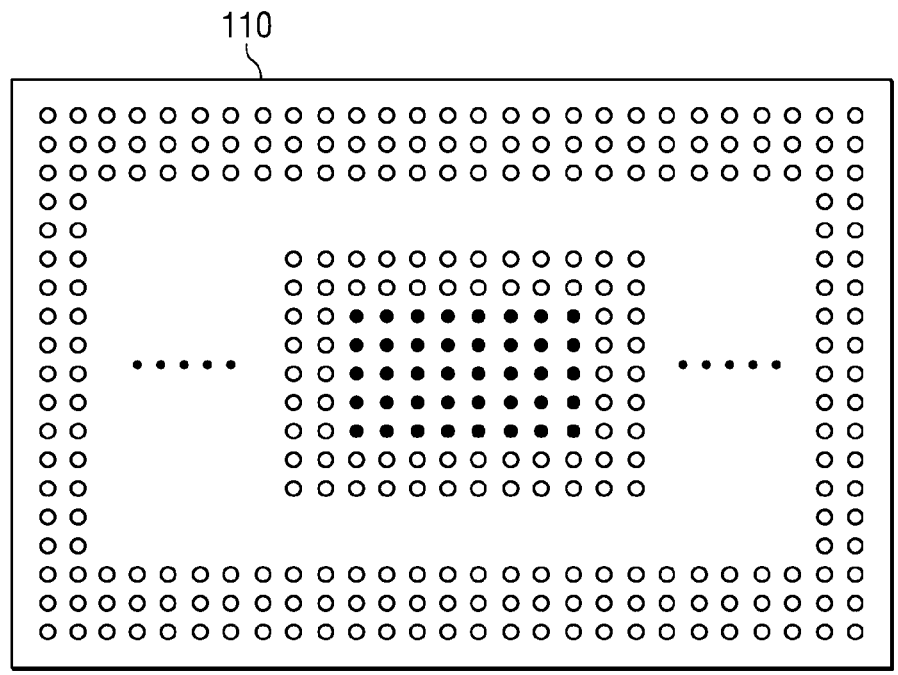
FIG. 13 is a top view of a micromirror array device formed on a die.
Figure 14:
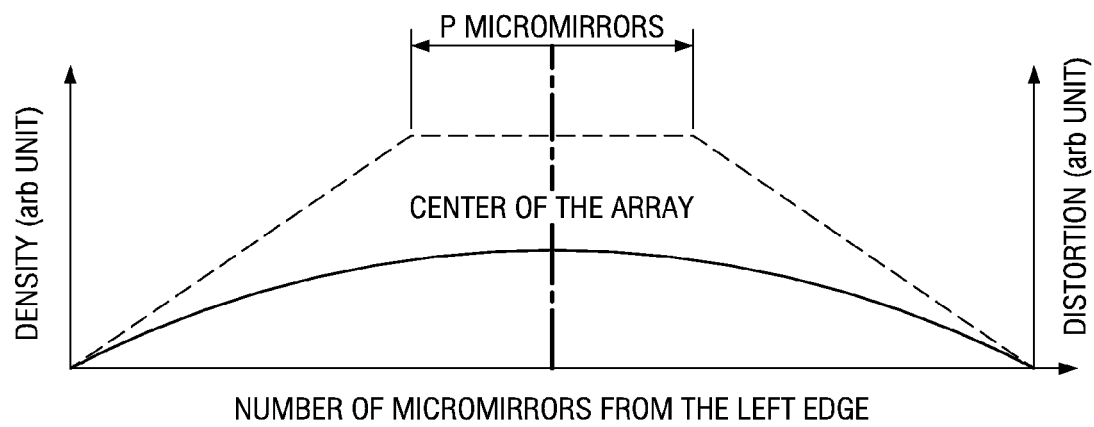
FIG. 14 plots a distribution of the pillars density and distribution of substrate distortion of the micromirror array device on the die in FIG. 13.

FIG. 13 illustrates a top view of the micromirror array device, such as the device in FIG. 1. The solid circles represent micromirrors each having at least one pillar. The open circles represent micromirrors having no pillar. In this example, pillars are provided for those micromirrors around the center of the device. This arrangement is in compliance with an observation that the substrate (e.g. substrate 116 in FIG. 1) has more deformation around the center and less near the edge. An exemplary distribution of the substrate deformation is illustrated as the dotted line in FIG. 14. Rather than providing the pillars only for the micromirrors near the center, the provided pillars may be distributed in the micromirrors as desired. For example, in addition to providing the pillars to the micromirrors around the center of the micromirror array device, pillars are also provided for selected micromirrors not around the center of the micromirror array device. The dashed line in FIG. 14 plots the density (defined as the number of pillars per unit area) of the pillars distributed in the micromirrors of an exemplary micromirror array device. The micromirrors in a region (having number of P micromirrors) around the center of the array are provided with at least one pillar. For the remaining micromirrors, the pillars are provided according to the distance from the edge of the device, wherein the distance is measured by the number of micromirrors. Specifically, the density of the pillars in those micromirrors can be linear. In an example, a plurality of pillars is provided for the micromirror array device and is randomly distributed in the micromirrors of the array.

Figure 18:
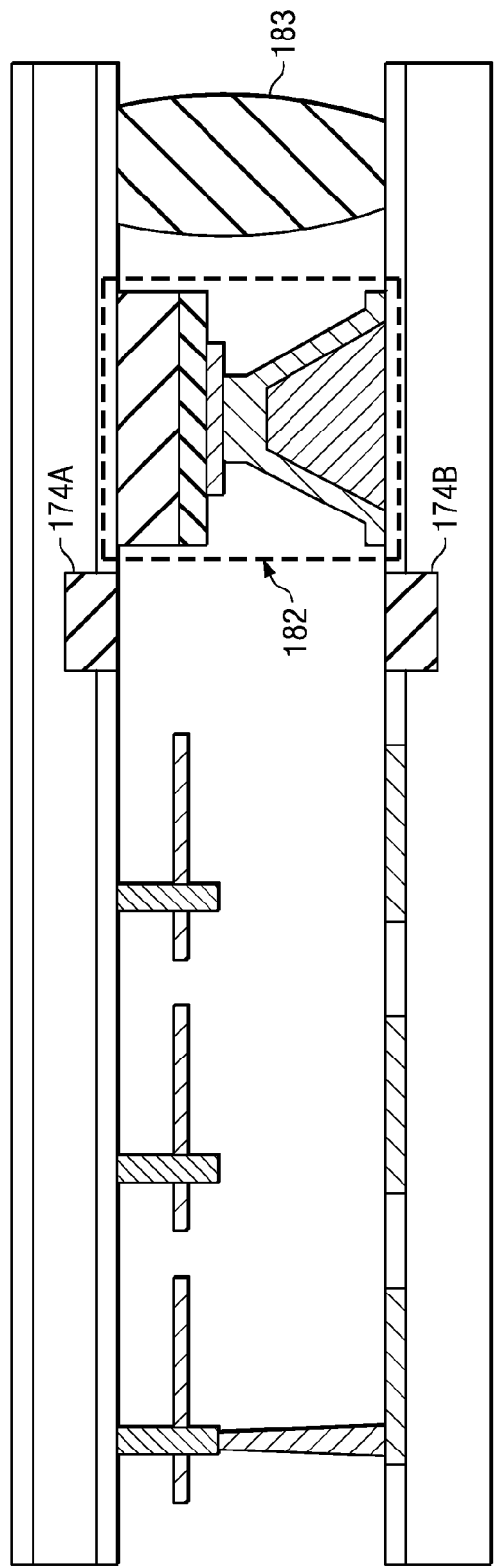

The micromirror array and the micromirror having a pillar can be fabricated in many ways. In the following, an exemplary fabrication method will be discussed with reference to FIG. 15 through. FIG. 18. It is understood by those skilled in the art that the method is applicable to other micromirror array devices having different pillar distributions or other type of microstructures having pillars between substrates.

Figure 15:
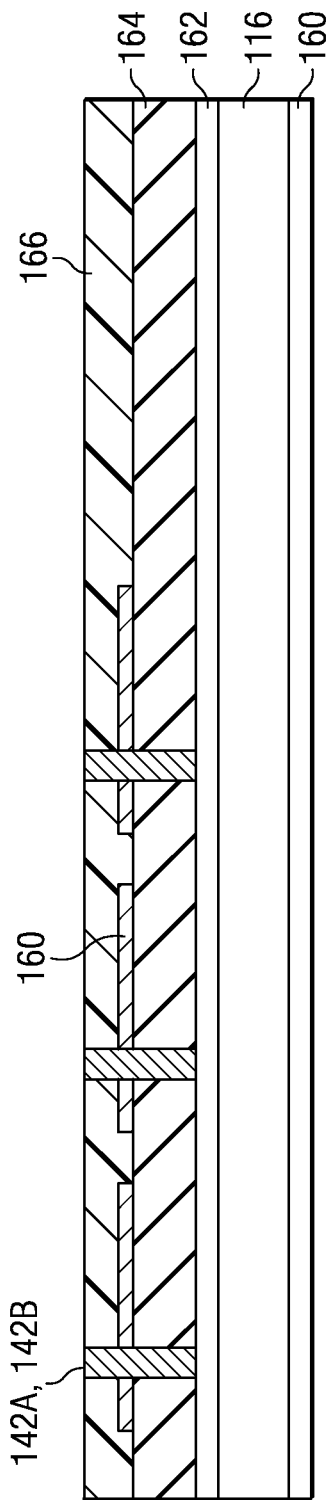
FIG. 15 through FIG. 18 illustrate an exemplary fabrication process of micromirror array device in FIG. 13.
Figure 16:
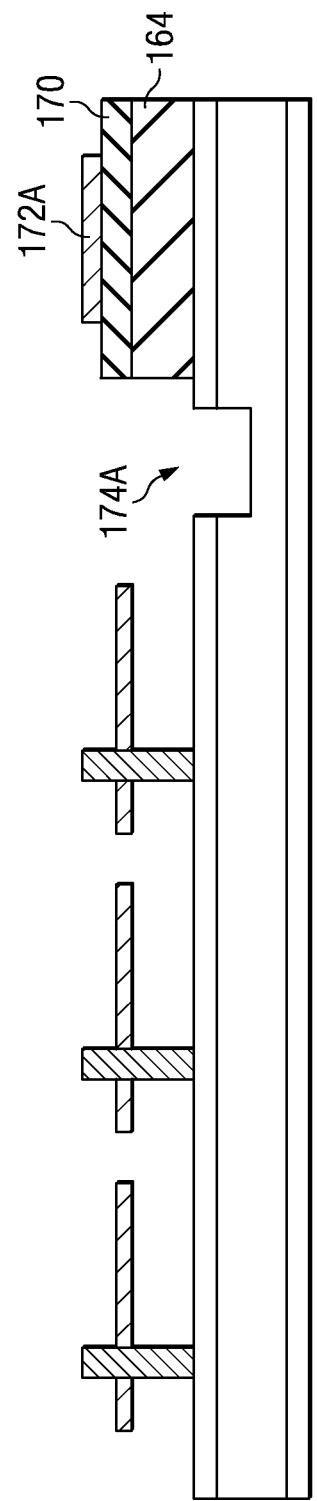

Referring to FIG. 15, an array of mirror plates is formed on glass substrate 116. Specifically, first sacrificial layer 164 is deposited on the glass substrate followed by deposition of the mirror plate layer 160. The glass substrate may have other films deposited thereon. For example, optical coating films, such as anti-reflection films 160 and 162 can be deposited on each surface of the glass substrate. Other coating films may also be deposited on the surfaces of the glass substrate or on the deposited optical films before depositing the first sacrificial layer. The mirror plate layer is then patterned into desired shapes. Second sacrificial layer 166 is deposited on the patterned mirror plates for forming the hinge (not shown) and posts (e.g. posts 142A and 142B). After the hinge and the posts are formed, the sacrificial layers are removed using selected etchant, such as a vapor phase interhalogen (e.g. bromine fluorides) and noble has halide (e.g. xenon fluorides). The micromirror array device after removing of the sacrificial layers is illustrated in FIG. 16.

The method as discussed above is applied to fabricate a micromirror with the hinge and the mirror plate on separate planes. This method is also applicable to fabricate a micromirror as shown in FIG. 7 or alike, in which post protrusions are provided. To obtain such a micromirror, a third sacrificial layer may be deposited on the second sacrificial layer. The posts protrusions are then formed on the third sacrificial layer.

After removal of the sacrificial layers, other structures can be formed. For example, a getter (e.g. a non-evaporate getter or dispensable getter) can be provided in trench 174A for absorbing containments, such as moisture or particles. The trench can be formed at any desired location of the substrate, such as a location near the edge of the substrate as shown in the figure.

In another example, light absorbing layer 170 can be formed on layer 164 that is deposited on substrate 116. Layer 164 can be the first or the second sacrificial layer. The light absorbing layer 170 can be a metallic layer that absorbs light from the light source so as to reduce light scattering and absorb scattered light by the components of the micromirrors or incoming light. On the metallic layer 170, a metallization bonding layer 172A can be deposited for bonding the glass substrate to the semiconductor substrate 114 in FIG. 1. In this example, the layers 164, 170 and 172 surround the circumference of the substrate 116.

Figure 17:
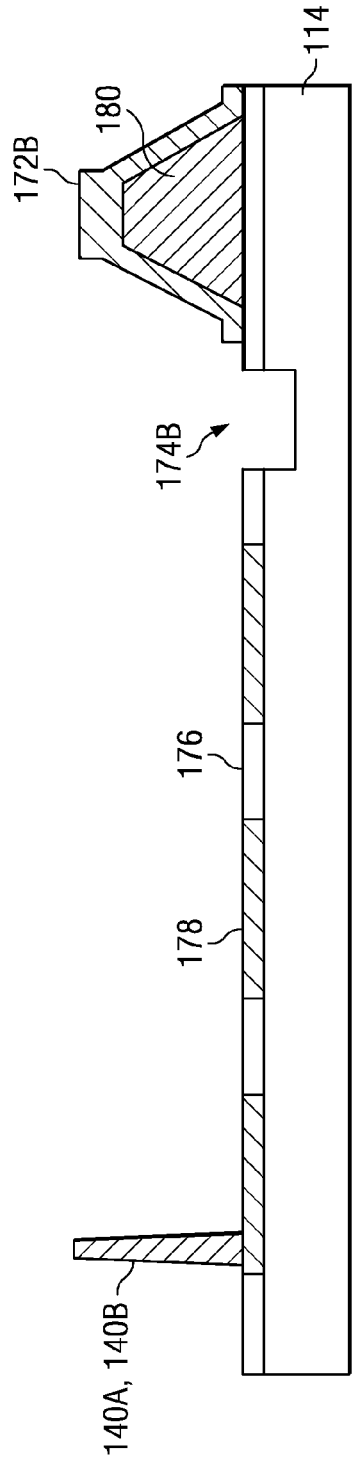

The fabrication of the pillars on the semiconductor substrate is illustrated in FIG. 17. Referring to FIG. 17, the semiconductor substrate 114 comprises an array of circuitry (e.g. DRAM or other type of memories) that is not shown. Layer 176 is deposited on the surface of the substrate for passivating the surface. The pillars 140A and 140B can be formed on the electrode by many ways, such as spinning the pillar material, curing the spun pillar material and patterning the cured pillar material on the electrode into desired shapes. As an example, the pillar is a tapered polyhedron. In addition to the pillars, other structures may be formed on substrate 114. For example, layer 180 comprising the pillar material can be formed and patterned followed by deposition and patterning of metallization layer 172B. Layers 180 and 172 fully surround the circumference of the substrate 114. Layer 180 and pillars 140A and 140B may have the same material, though not required. Trench 174B can be formed for holding a getter (e.g. a non-evaporate getter or dispensable getter) material so as to absorb containments, such as moisture or particles. The trench can be formed at any desired location of the substrate, such as a location near the edge of the substrate.

The glass (or quartz) substrate 116 with micromirrors formed thereon as shown in FIG. 17 and the semiconductor (e.g. silicon) substrate 114 with the electrodes and pillars formed thereon as shown in FIG. 16 are then bonded together as shown in FIG. 18. Referring to FIG. 18, substrates 114 and 116 are first aligned such that the pillars are aligned with the corresponding posts. Meanwhile, as indicated at 182, the sealing ring comprising layers 164, 170 and 172 on substrate 116 is aligned with the sealing ring comprising layers 180 and 172 on substrate 114. The aligned substrates and the sealing rings on the substrates are cured. As an example, the substrates and the sealing rings are cured at a temperature of from 100° C. to 200° C., or around 120° C. As another example, the substrates can be cured at the melting temperature or higher of the metallization layers 172. The metallization layers 172 on the substrates 114 and 116 are then melted to bond the substrates and form a hermetic seal to the substrates. The bonded and hermetically sealed substrates are then cooled down to a temperature below 100° C., such as 70° C. As a result, the pressure inside the hermetically sealed space between the substrates is below the atmosphere, such as 500 Torr or lower, or 200 Torr or lower, or 100 Torr or lower. The reduced pressure between the bonded and hermetically sealed substrates is of great importance when the micromirror array device is operated in a typical operation environment of room temperature and at 1 atmosphere. Specifically, the reduced pressure between the substrates can prevent increase of the gap between the substrates due to outwards expansion of the substrates in the presence of temperature variation. For this reason, the pressure inside the hermetically sealed package can be of any pressure below one atmosphere, such as 250 Torr or less, or 50 Torr or less, or 10 Torr or less, or 1 Torr or less, or 100 mTorr or less. The low pressure inside the hermetically sealed package can also be obtained through many other ways, such as sealing the package within a low pressure chamber.

As another example, before aligning the substrates, a ultraviolet light (UV) or UV/infra-radiation light curable material, such as epoxy 183 or alike can be deposited around the perimeter of one or both substrates outside or inside seal ring 182. The substrates are then aligned; and a hermetical seal is formed to bond the substrates. The hermetically sealed substrates may be cooled down to a temperature below 100° C. to obtain a reduced pressure between the substrates. Epoxy 183 is then cured to add bonding strength to the hermetic seal. Getter materials (e.g. non-evaporate or dispensable getter materials) can be provided in trenches 174A and 174B on the substrates for absorbing containments, such as moisture or particles. The getter materials in the trenches may or may not be the same. The trench can be formed at any desired location of the substrate, such as a location near the edge of the substrate. Lubricant materials for lubricating the surfaces of the micromirror device can also be disposed in the trenches.

In accordance with an embodiment of the invention, the bonding and sealing of the substrate can be performed in a pressured chamber. During the bonding and sealing, the volume between the two substrates decreases, resulting in increase of pressure between the substrates. This pressure variation may burst the sealing material between the substrates. For this and other reasons, the bonding and sealing of the substrates are performed within a chamber that has a pressure proximate to the internal pressure of the seal gap between the substrates. In this way, the pressure between the substrates during the bonding and sealing is in equilibrium with the environment pressure.

Figure 19:
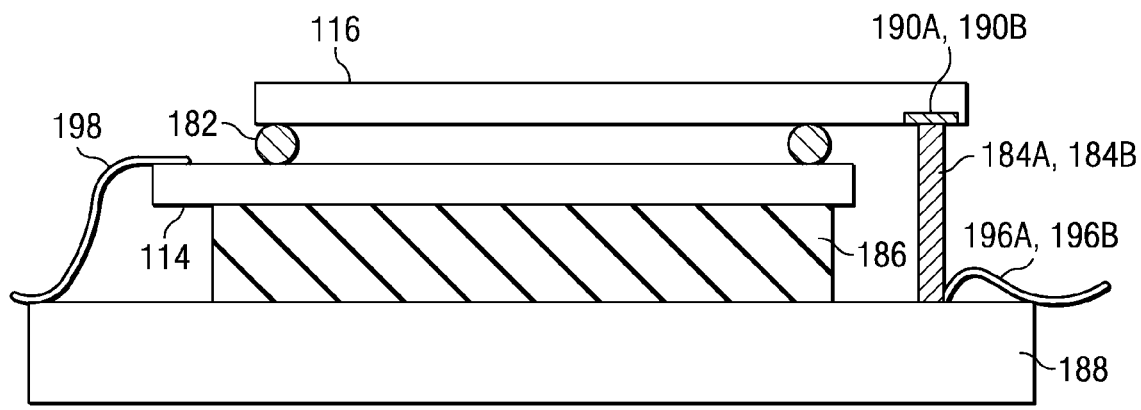
FIG. 19 is a cross-sectional view of the micromirror device on a package substrate according to an embodiment of the invention.

The bonded and hermetically sealed substrates, referred to as an assembly, are packaged, which is shown in FIG. 19. As an example, the assembly comprising bonded substrates 114 and 116 is attached to package substrate 188. Sealing ring 182 is deposited around the perimeter of the substrates. A substrate insert 186 can be disposed between substrate 188 and substrate 114 for many advantages, such as preventing deformation of substrate 188 and providing efficient heat conductor for dissipating heat in the assembly.

Figure 20:
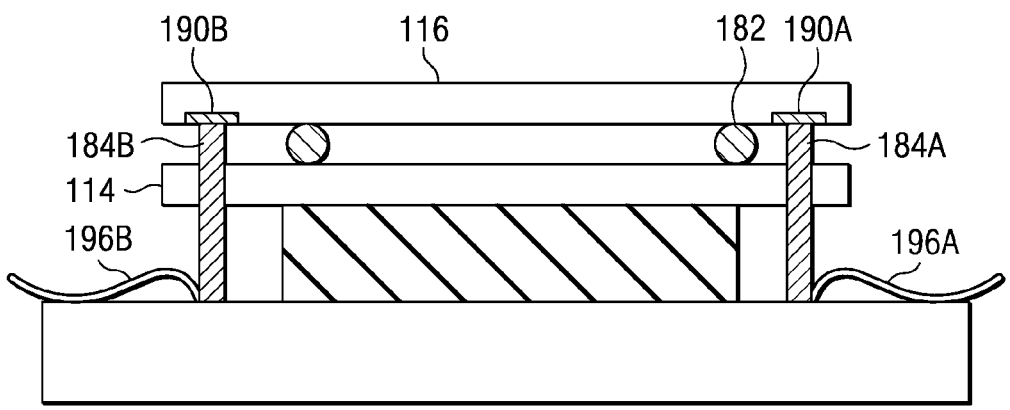
FIG. 20 is a another cross-sectional view of the micromirror device of FIG. 19.
Figure 21:
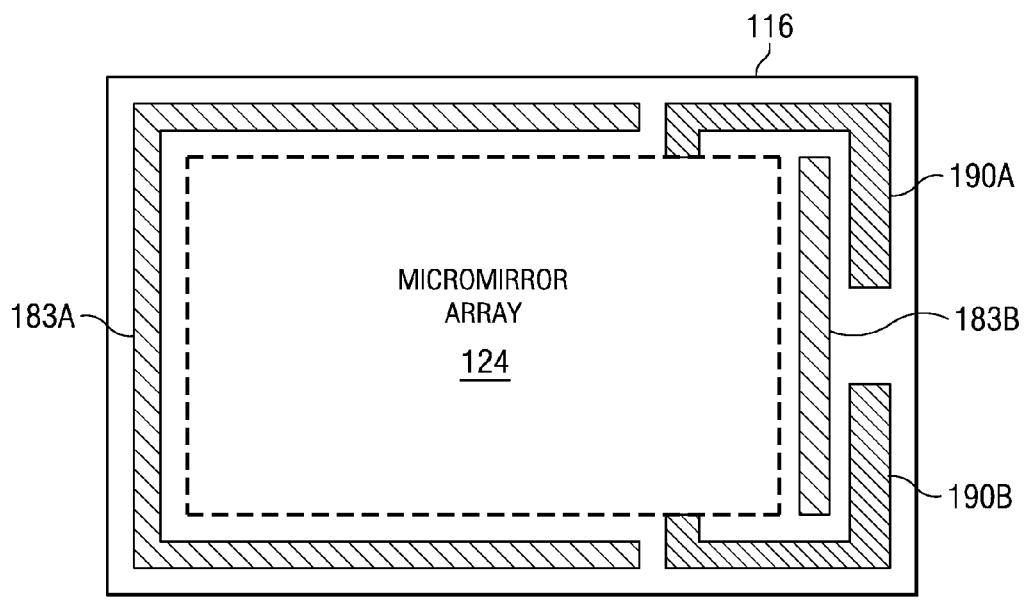
FIG. 21 is a top view of the micromirror array device assembly of FIG. 19.

Electric contact between the micromirrors in substrate 116 and electrodes on substrate 114 can be made in a variety of ways. As a way of example, multiple electric contact pads can be provided for the micromirrors in substrate 116, such as two electric contact pads 190A and 190B in FIG. 21. Referring to FIG. 21, sealing ring comprises multiple segments, such as 183A and 183B so as to form gaps between the segments for allowing the electrical contact pads to pass through. The electrical contact pads are connected to the micromirrors of micromirror array 124. The multiple electrical contact pads also enable the resistance measurement of the micromirrors of the array. The measured resistance can be used to determine the quality of the electrical inter-connection of the micromirrors in the array. The electrical contact pads are then connected to multiple shims 184A and 184B as shown in FIG. 19. Referring back to FIG. 19, shims 184A and 184B extend the electrical contact pads 190A and 190B onto package substrate 188. Electrical contact wires 196A and 196B are respectively connected to the shims, which is better illustrated in FIG. 20. Referring to FIG. 20, shim 184A electrically contacts electrical contact pad 190A on substrate 116 and wire 196A on package substrate 188. And shim 184B electrically contacts electrical contact pad 190B on substrate 116 and wire 196B on package substrate 188. External power supplies can thus be connected to the wires so as to provide electrical power to the micromirrors. Referring back to FIG. 19, electrical contact of the electrodes (and circuitry) on substrate 114 can be made through electrical wires 198. The external power supplies can be connected to wire 198 and provide electrical power to the electrodes. In the above example, two electrical contact pads are provided for the substrate on which the micromirrors are formed. In fact, other number (e.g. one, or more than two) of electrical contact pads may be formed on substrate 116. Accordingly, the number of shims connected to the electrical contact pads changes with the number of electrical contact pads.

Figure 22:
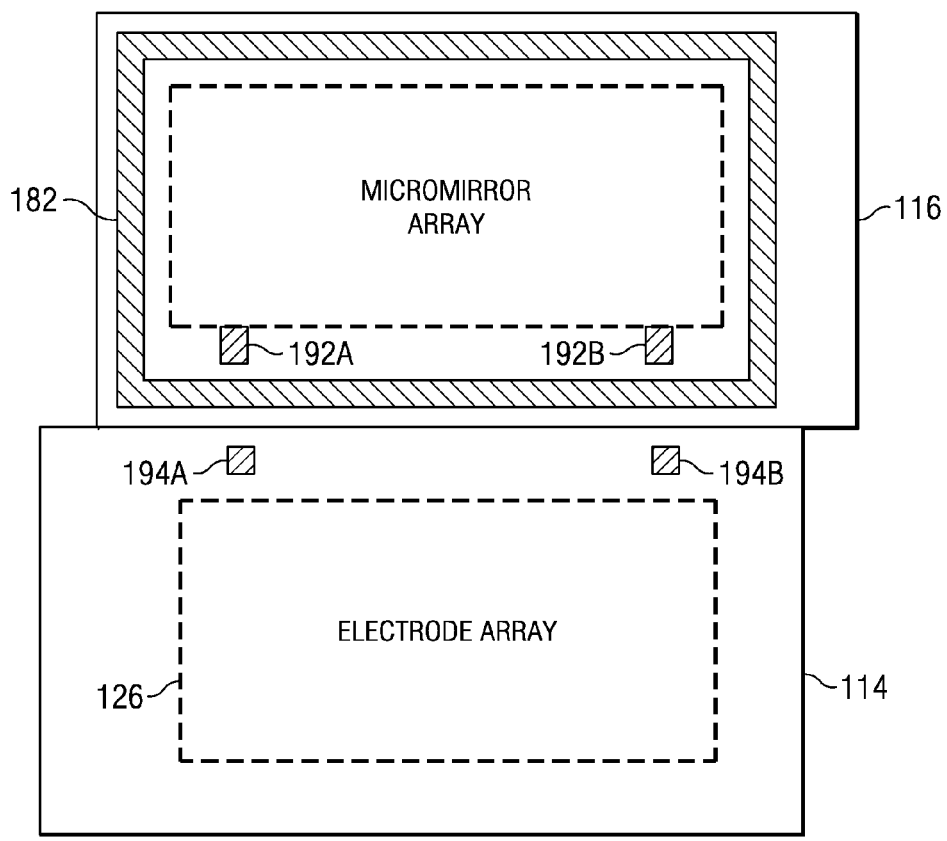
FIG. 22 is a top view of another the micromirror array device assembly.

As another example of the invention, electrical contact between the two substrates is made through multiple contact areas, such as that shown in FIG. 22. Referring to FIG. 22, multiple contact areas, such as 192A and 192B that are connected to the micromirrors of the micromirror array are formed on substrate 116. The contact areas can be of any desired shapes and areas. The areas may also be in different configuration. For example, one contact area is rectangular and the other one is circle. The areas can be disposed at any desired locations on the substrate as long as they are electrically connected to the micromirrors.

Corresponding to contact areas 192A and 192B on substrate 116, contact areas 194A and 194B are formed on substrate 114. When the two substrates are joined together, the electrical contact areas 192A and 194A, and 192B and 194B are overlapped so as to form electrical connection.

The electric contacts, such as the electrical contact pads 190A and 190B, and electrical contact areas 192A, 912B, 194A, and 194B may comprise any suitable material, such as electrical conductor (e.g. electrical conducting epoxy) or electrical insulator (e.g. non-electrical-conducting epoxy). When an electrical insulator is used, an electrical conducting spacer (not shown) is provided between the substrates (e.g. substrates 114 and 166).

Figure 23:
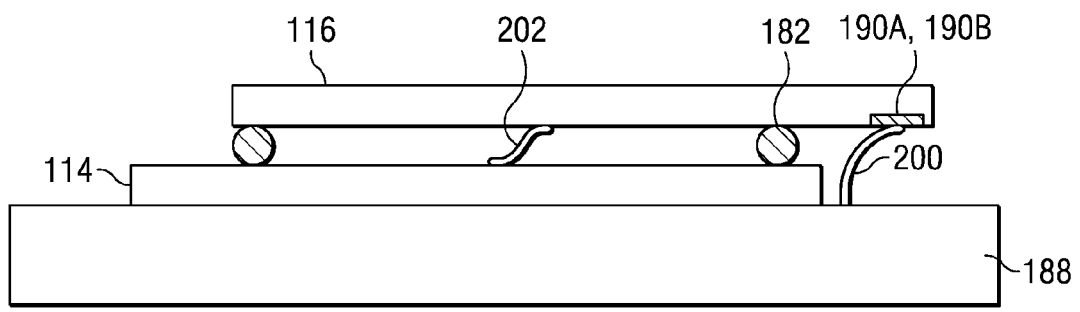
FIG. 23 is a cross-sectional view of a micromirror array device assembly according to another embodiment of the invention.

In yet another example of the invention, electrical contact of the two substrates are made through a contact spring or alike, as shown in FIG. 23. Electrical springs 200 are formed on substrate 188. When the two substrates are jointed together, the electrical springs are pressed against the electrical contact pads on substrate 116 so as to form electrical contact. Alternatively, an electrical contacting cantilever 202 can be made on substrate 188 for electrically contacting substrate 116.

During the assembling and packaging processes, surfaces of the micromirror device may be contaminated. Contamination of the interior surfaces of the assembly (e.g. the bottom surface of substrate 116 and the surfaces of the micromirrors and the top surface of substrate 114) can be prevented by hermetically sealing of substrates 114 and 116 with sealing material 182. However, the exterior surface of the assembly, such as the top surface of the glass substrate 116 is exposed to contamination. To solve this problem, a sacrificial substrate is provided and sealed with substrate 116 such that the top surface of substrate 116 can be encapsulated between the sacrificial substrate and substrate 116 during the assembly and packaging process, as illustrated in FIG. 24.

Figure 24:
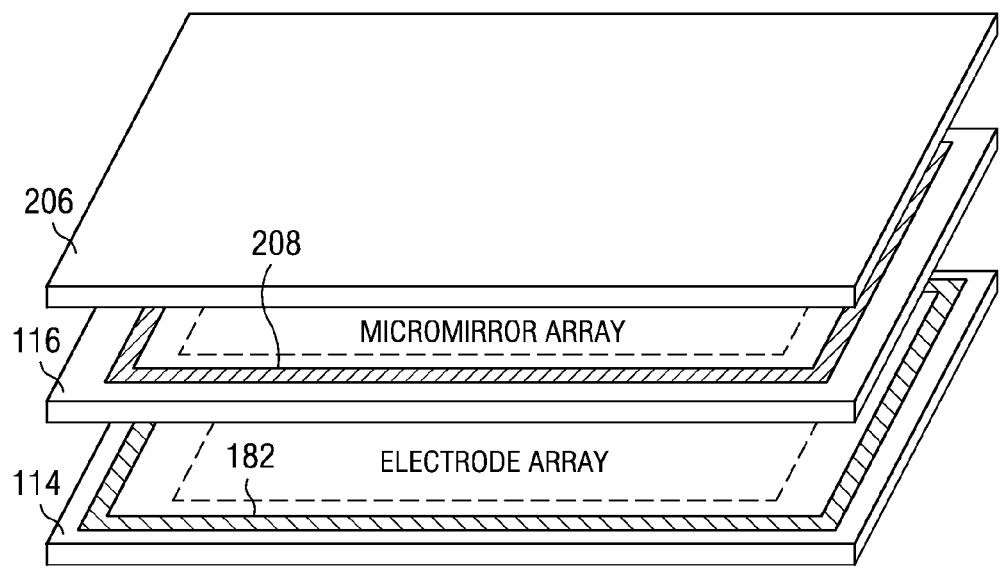
FIG. 24 is a perspective view of a micromirror device during a fabrication according to an embodiment of the invention.

Referring to FIG. 24, substrate 114 having the electrode array formed thereon can be hermetically sealed with substrate 116 on which the micromirror array is formed. The hermetical seal is made through sealing material 182. The top surface of substrate 114 and the bottom surface of substrate 116 can thus be prevented from contamination. To protect the top surface of substrate 116, sacrificial substrate 206 is provided and bonded to substrate 116 with sealing material 208. The sealing of substrates 206 and 116 can be performed before or after the hermetically sealing of substrates 114 and 116, or during the fabrication process, which will be discussed in detail in the following.

Figure 25:
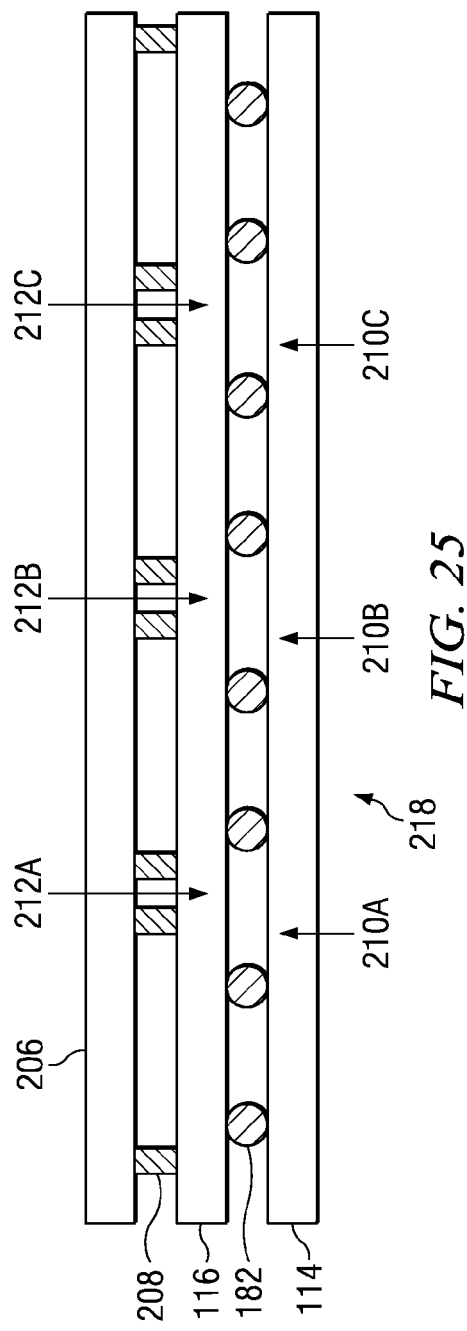
FIG. 25 is a cross-sectional view of a plurality of micromirror devices during an exemplary fabrication according to the invention.

Referring to FIG. 25, a cross-sectional view of a plurality of micromirror array devices during fabrication is illustrated therein. For simplicity and demonstration purposes only, only four micromirror array devices are shown. In an exemplary fabrication process, fabrication of the electrode arrays on the standard semiconductor substrate 114 and the fabrication of the micromirror arrays on substrate 116 are performed separately. For example, the electrode arrays, as well as the associated circuitries (e.g. random-access-memories), are formed on substrate 114 using standard integrated circuit fabrication techniques. Separate from the fabrication of the electrodes, the micromirrors are formed on substrate 116. The micromirrors can be fabricated on substrate 116 in a verity of ways, such as the methods set forth in U.S. patent application Ser. No. 10/366,296 to Patel et al, filed on Feb. 12, 2003, Ser. No. 10/366,297 to Patel et al, filed on Feb. 12, 2003, Ser. No. 10/402,789 to Patel, filed on Mar. 28, 2003, Ser. No. 10/402, 889 to Patel, filed on Mar. 28, 2003, Ser. No. 10/627,105, filed on Jul. 24, 2003, Ser. No. 10/613,379, filed on Jul. 3, 2003, Ser. No. 10/437,776, field on May 13, 2003, Ser. No. 10/698,513, filed on Oct. 30, 2003, the subject matter of each being incorporated herein by reference. During the fabrication of the micromirrors on substrate 116, sealing rings, such as sealing ring 208 is deposited on the top surface of substrate 116. An exemplary sealing ring 208 is illustrated in FIG. 24. Sacrificial substrate 206, which can be glass, is bonded to substrate 116 with the sealing rings 208. The sealing rings 208 can also be deposited on sacrificial substrate 206. The sealing of the sacrificial substrate 206 and substrate 116 can be performed before the fabrication of the micromirrors, for example before depositing a sacrificial layer on substrate 116. Alternatively, the sealing of the sacrificial substrate and substrate 116 is made after the formation of the functional components of the micromirrors but before removing the sacrificial material through etching. In another example, the sealing of the sacrificial substrate and substrate 116 can be made after the removal of the sacrificial material but before assembling substrates 114 and 116.

Figure 26B:
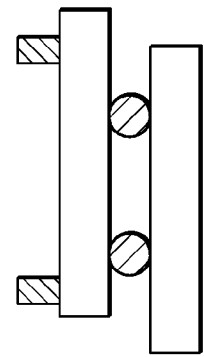
FIGS. 26A and 26B are cross-sectional views of a micromirror device in FIG. 25 before and after removal of a substrate provided during the fabrication for protecting the surface of the micromirror device.
Figure 26A:
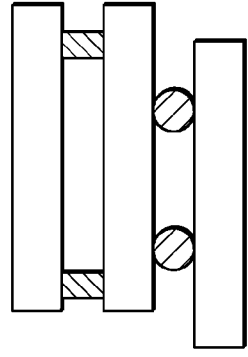

When the micromirror arrays on substrate 116 and the electrode arrays on substrate 114 are formed, substrates 114 and 116 are sealed using sealing material 182. Then the assembly is cut into dies, each die comprising a micromirror array device, such as the micromirror array device shown in FIG. 3. As an exemplary cutting method of the invention, the sacrificial substrate 206 and substrate 116 are cut along cutting lines 212A, 212B and 212C as shown in the figure. These cutting lines stop before the bottom surface of substrate 116. Substrate 114 is cut into segments along cutting lines 210A, 210B and 210C, each of which is offset from the corresponding cutting lines for substrates 206 and 116. For example, cutting line 210A stops before the top surface of substrate 114 and has an offset from cutting line 212A. Cutting line 210B stops before the top surface of substrate 114 and has an offset from cutting line 212B. After such cutting, micromirror array devices are singulated, such as micromirror array device 218 in FIG. 26A. After the singulation, the sacrificial substrate 206 on each micromirror array device is removed. The micromirror device 218 in FIG. 26A after removal of the sacrificial substrate 206 is illustrated in FIG. 26B. Sealing material 208 on the top surface of substrate 116 may or may not be removed. Instead of removing the sacrificial substrate (206) after singulation, the sacrificial substrate can be removed at other stages during the fabrication. For example, the sacrificial substrate can be removed before or during or even after the device testing in which the product quality and performances are evaluated. The removal of the sacrificial substrate can also be carried out before or during packaging the micromirror array device but before encapsulating the device with the attachment of the a package cover lid.

It will be appreciated by those of skill in the art that a new and useful micromirror array device having a plurality of in-array pillars has been described herein. In view of many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

We claim:

1. A method of forming a microelectromechanical system (MEMS) device, the method comprising:
    providing a MEMS structure on a first substrate;
    providing a second substrate; and
    hermetically bonding the first substrate and the second substrate together to form an assembly such that the MEMS structure is positioned between the substrates;
    wherein the step of bonding the first substrate and the second substrate further includes:
    forming a first sealing ring on the first substrate;
    forming a second sealing ring on the second substrate; and
    bonding the first sealing ring to the second sealing ring to hermetically bond the first substrate and the second substrate with the bonded sealing rings circumferentially surrounding the MEMS structure;
    wherein the first sealing ring comprises a first layer of material deposited on the first substrate, and at least one layer of metallic material deposited over the first layer of material;
    wherein the second sealing ring comprises a first layer of material deposited on the second substrate, and at least one layer of metallic material deposited over the first layer of material; and
    wherein bonding the first sealing ring to the second sealing ring comprises melting at least one of the metallic layers of the at least one of the first and second sealing rings.

2. The method of claim 1, further comprising forming a trench perimetrically of the MEMS structure inside the first sealing ring on the first substrate.

3. The method of claim 2, further comprising forming at least one of a getter or lubricant material within the trench.

4. The method of claim 1, further comprising depositing a curable material perimetrically of the MEMS structure on one or both substrates, outside the bonded sealing rings, and curing the material between and in contact with the first and second substrates.

5. The method of claim 4, wherein the curable material is epoxy.

6. A method of forming a microelectromechanical system (MEMS) device, the method comprising:
    forming a plurality of MEMS elements on a first substrate;
    providing a second substrate; and
    hermetically bonding the first substrate and the second substrate together to form an assembly such that the MEMS elements are positioned between the substrates;
    wherein the step of bonding the first substrate and the second substrate further includes:
    forming a first sealing ring on the first substrate;
    forming a second sealing ring on the second substrate; and
    bonding the first sealing ring to the second sealing ring to hermetically bond the first substrate and the second substrate with the bonded sealing rings circumferentially surrounding the MEMS elements;
    wherein the first sealing ring comprises a first layer of material deposited on the first substrate, and at least one layer of metallic material deposited over the first layer of material;
    wherein the second sealing ring comprises a first layer of material deposited on the second substrate, and at least one layer of metallic material deposited over the first layer of material; and
    wherein bonding the first sealing ring to the second sealing ring comprises melting at least one of the metallic layers of the at least one of the first and second sealing rings.

7. The method of claim 6, further comprising forming a trench perimetrically of the MEMS elements inside the first sealing ring on the first substrate.

8. The method of claim 7, further comprising depositing a curable material perimetrically of the MEMS elements on one of the first and second substrates, outside the bonded sealing ring formed on that surface, and curing the material between and in contact with the first and second substrates.

9. The method of claim 8, wherein the MEMS device is a spatial light modulator for use in a display system and the MEMS elements are micromirrors.

* * * * *